US011342900B2

United States Patent
Kizu et al.

(10) Patent No.: US 11,342,900 B2
(45) Date of Patent: May 24, 2022

(54) QUARTZ CRYSTAL RESONATOR, QUARTZ CRYSTAL RESONATOR UNIT, AND METHOD OF MANUFACTURING QUARTZ CRYSTAL RESONATOR

(71) Applicant: Murata Manufacturing Co., Ltd., Nagaokakyo (JP)

(72) Inventors: Toru Kizu, Nagaokakyo (JP); Koki Sai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 831 days.

(21) Appl. No.: 16/220,651

(22) Filed: Dec. 14, 2018

(65) Prior Publication Data
US 2019/0123714 A1     Apr. 25, 2019

Related U.S. Application Data

(63) Continuation of application No. PCT/JP2017/022517, filed on Jun. 19, 2017.

(30) Foreign Application Priority Data

Jun. 21, 2016  (JP) .............................. JP2016-122948

(51) Int. Cl.
*H03H 9/19*      (2006.01)
*H03H 9/02*      (2006.01)
(Continued)

(52) U.S. Cl.
CPC ............... *H03H 9/19* (2013.01); *H01L 41/29* (2013.01); *H01L 41/332* (2013.01);
(Continued)

(58) Field of Classification Search
CPC .... H03H 9/19; H03H 9/0595; H03H 9/02157; H03H 9/0509; H03H 9/1014; H03H 9/13
See application file for complete search history.

(56) References Cited

U.S. PATENT DOCUMENTS

| 10,892,734 | B2 * | 1/2021 | Matsuo | ..................... H03H 9/19 |
| 2008/0036335 | A1 | 2/2008 | Naito et al. | |
| 2015/0229291 | A1 * | 8/2015 | Lim | ......................... H03H 9/19 216/41 |

FOREIGN PATENT DOCUMENTS

| JP | 2008067345 A | 3/2008 |
| JP | 2011193292 A | 9/2011 |

(Continued)

OTHER PUBLICATIONS

International Search Report issued for PCT/JP2017/022517, dated Aug. 22, 2017.

(Continued)

*Primary Examiner* — J. San Martin
(74) *Attorney, Agent, or Firm* — ArentFox Schiff LLP

(57) ABSTRACT

A quartz crystal resonator that includes an AT-cut quartz crystal blank including a first main surface and a second main surface that face each other and each of which has long sides extending in an X-axis direction of the quartz crystal blank and short sides extending in a Z'-axis direction of the quartz crystal blank, and a first side surface and a second side surface that are located adjacent to the long sides of the first main surface and the second main surface; a first excitation electrode and a second excitation electrode; and an extension electrode that extends from the first main surface to the second main surface along the first side surface and that is electrically connected to the first excitation electrode. Each the first and second side surfaces have a first m-plane face and a second m-plane face.

14 Claims, 10 Drawing Sheets

(51) Int. Cl.
*H03H 9/05* (2006.01)
*H01L 41/29* (2013.01)
*H01L 41/332* (2013.01)
*H03H 9/10* (2006.01)
*H03H 9/13* (2006.01)

(52) U.S. Cl.
CPC ...... *H03H 9/02157* (2013.01); *H03H 9/0509* (2013.01); *H03H 9/0595* (2013.01); *H03H 9/1014* (2013.01); *H03H 9/13* (2013.01)

(56) References Cited

FOREIGN PATENT DOCUMENTS

| | | | |
|---|---|---|---|
| JP | 2014011650 A | | 1/2014 |
| JP | 5719056 B1 | * | 5/2015 |
| JP | 2015186239 A | | 10/2015 |
| JP | 2015188218 A | * | 10/2015 |
| JP | 2016034107 A | | 3/2016 |

OTHER PUBLICATIONS

Written Opinion of the International Searching Authority issued for PCT/JP2017/022517, dated Aug. 22, 2017.

* cited by examiner

QUARTZ CRYSTAL RESONATOR, QUARTZ CRYSTAL RESONATOR UNIT, AND METHOD OF MANUFACTURING QUARTZ CRYSTAL RESONATOR

CROSS REFERENCE TO RELATED APPLICATIONS

The present application is a continuation of International application No. PCT/JP2017/022517, filed Jun. 19, 2017, which claims priority to Japanese Patent Application No. 2016-122948, filed Jun. 21, 2016, the entire contents of each of which are incorporated herein by reference.

FIELD OF THE INVENTION

The present invention relates to a quartz crystal resonator, a quartz crystal resonator unit, and a method of manufacturing a quartz crystal resonator, and, in particular, to a quartz crystal resonator including an AT-cut quartz crystal blank.

BACKGROUND OF THE INVENTION

Quartz crystal resonator units are widely used as a signal source of a reference signal used in an oscillation device, a band pass filter, or the like. In a quartz crystal resonator unit, a quartz crystal resonator is contained in a holder that is composed of a base member and a lid member. Examples of a quartz crystal resonator include an AT-cut quartz crystal resonator that uses a thickness shear mode as a main vibration as described in Patent Documents 1 and 2. For example, a quartz crystal resonator described in Patent Document 1 includes a quartz crystal blank, which is made from an AT-cut quartz crystal plate, and excitation electrodes. Both side surfaces of an excitation portion of the quartz crystal blank in the long-side direction are each composed of two surfaces that are respectively an m-plane face and a non-m-plane face of the quartz crystal.

Patent Document 1: Japanese Unexamined Patent Application Publication No. 2008-67345
Patent Document 2: Japanese Unexamined Patent Application Publication No. 2011-193292

SUMMARY OF THE INVENTION

However, in the existing structure, the non-m-plane face of a side surface of the quartz crystal blank abuts on a long side of a main surface at an angle that is slightly larger than a right angle. Therefore, when forming an excitation electrode and necessary electrodes by performing sputtering or vapor deposition on the main surface of the quartz crystal blank, there may be a case where an electrode material is not appropriately applied to the non-m-plane face. Thus, there is a probability that an extension electrode, which extends to front and back main surfaces along a side surface of the quartz crystal blank, may break at the non-m-plane face.

The present invention has been made in consideration of the above circumstances, and an object thereof is to provide a quartz crystal resonator, a quartz crystal resonator unit, and a method of manufacturing a quartz crystal blank with which it is possible to suppress occurrences of faulty electrical connections.

A quartz crystal resonator according to an aspect of the present invention includes an AT-cut quartz crystal blank including a first main surface and a second main surface that face each other and each of which has long sides extending in an X-axis direction of a quartz crystal and short sides extending in a Z'-axis direction of the quartz crystal, and a first side surface and a second side surface that are located adjacent to the long sides of the first main surface and the second main surface; a first excitation electrode on the first main surface of the quartz crystal blank; a second excitation electrode on the second main surface of the quartz crystal blank; an extension electrode that extends from the first main surface to the second main surface along the first side surface and that is electrically connected to the first excitation electrode; a first connection electrode on the second main surface and that is electrically connected to the first excitation electrode via the extension electrode; and a second connection electrode on the second main surface and that is electrically connected to the second excitation electrode. The first side surface includes a first m-plane face of the quartz crystal and a first non-m-plane face of the quartz crystal, the first m-plane face abutting on a long side of the first main surface at an angle $\theta 1$, the first non-m-plane face abutting on a long side of the second main surface at an angle $\theta 2$. The second side surface includes a second non-m-plane face of the quartz crystal and a second m-plane face of the quartz crystal, the second non-m-plane face abutting on a long side of the first main surface at the angle $\theta 2$, the second m-plane face abutting on a long side of the second main surface at the angle $\theta 1$. The angles $\theta 1$ and $\theta 2$ are each obtuse angles, and the angle $\theta 1$ is an obtuse angle that is larger than the angle $\theta 2$. A width of the first m-plane face of the first side surface is larger than a width of the second m-plane face of the second side surface in a width direction that is perpendicular to the long sides in the X-axis direction.

With the structure described above, the width of the m-plane face of the first side surface, along which the extension electrode extends from the front main surface to the back main surface of the quartz crystal blank, is larger than the width of the m-plane face of the second side surface. Because the inclination angle of the m-plane face from the main surface is gentler than that of the non-m-plane face, it is easy to form the extension electrode so as to extend from the front main surface to the back main surface of the quartz crystal blank, and it is possible to prevent breakage of the extension electrode. Thus, occurrence of faulty electrical connections can be suppressed.

A quartz crystal resonator according to an further aspect of the present invention includes an AT-cut quartz crystal blank including a first main surface and a second main surface that face each other and each of which has long sides extending in an X-axis direction of a quartz crystal and short sides extending in a Z'-axis direction of the quartz crystal, and a first side surface and a second side surface that are located adjacent to the long sides of the first main surface and the second main surface; a first excitation electrode that is disposed on the first main surface of the quartz crystal blank; a second excitation electrode on the second main surface of the quartz crystal blank; an extension electrode that extends from the first main surface to the second main surface along the second side surface and that is electrically connected to the first excitation electrode; a first connection electrode on the second main surface and that is electrically connected to the first excitation electrode via the extension electrode; and a second connection electrode on the second main surface and that is electrically connected to the second excitation electrode. The first side surface includes a first non-m-plane face of the quartz crystal and a first m-plane face of the quartz crystal, the first non-m-plane face abutting on a long side of the second main surface at an angle $\theta 2$, the first m-plane face abutting on a long side of the first main surface at an angle θ1. The second side surface includes a second m-plane face of the quartz crystal and a second non-m-plane face of the quartz crystal, the second m-plane face abutting on a long side of the second main surface at the angle θ1, the second non-m-plane face abutting on a long side of the first main surface at the angle θ2. The angles θ1 and θ2 are each obtuse angles, and the angle θ1 is an obtuse angle that is larger than the angle θ2. A width of the second m-plane face of the second side surface is larger than a width of the first m-plane face of the first side surface in a width direction that is perpendicular to the long sides in the X-axis direction.

With the structure described above, the width of the m-plane face of the second side surface, along which the extension electrode extends from the front main surface to the back main surface of the quartz crystal blank, is larger than the width of the m-plane face of the first side surface. Because the inclination angle of the m-plane face from the main surface is gentler than that of the non-m-plane face, it is easy to form the extension electrode that extends from the front main surface to the back main surface of the quartz crystal blank, and it is possible to prevent breakage of the extension electrode. Thus, occurrences of faulty electrical connections can be suppressed.

A method of manufacturing a quartz crystal blank according to an aspect of the present invention includes a step of preparing an AT-cut quartz crystal substrate having a first main surface and a second main surface that face each other and each of which extends in an X-axis direction and a Z'-axis direction of a quartz crystal; a step of placing a first mask on the first main surface of the quartz crystal substrate and placing a second mask on the second main surface of the quartz crystal substrate such that a part of the second mask overlaps a part of the first mask when the first main surface is viewed in a plan view from the first main surface; and a step of forming a quartz crystal blank by wet etching the quartz crystal substrate to form each of the first main surface and the second main surface into a rectangular shape having long sides extending in the X-axis direction and short sides extending in the Z'-axis direction, the quartz crystal blank including a first side surface and a second side surface that are located adjacent to the long sides of the first main surface and the second main surface. The first side surface includes a first m-plane face of the quartz crystal and a first non-m-plane face of the quartz crystal, the first m-plane face abutting on a long side of the first main surface at an angle θ1, the first non-m-plane face abutting on a long side of the second main surface at an angle θ2. The second side surface includes a second non-m-plane face of the quartz crystal and a second m-plane face of the quartz crystal, the second non-m-plane face abutting on a long side of the first main surface at the angle θ2, the second m-plane face abutting on a long side of the second main surface at the angle θ1. The angle θ1 is an obtuse angle that is larger than the angle θ2. A width of the first m-plane face of the first side surface is larger than a width of the second m-plane face of the second side surface in a width direction that is perpendicular to the long sides in the X-axis direction.

With the structure described above, it is possible to manufacture a quartz crystal blank that can suppress, for example, occurrence of faulty electrical connections.

As described in more detail below, the present inventions make it is possible to suppress occurrences of faulty electrical connection.

DETAILED DESCRIPTION OF THE PREFERRED EMBODIMENTS

Hereinafter, embodiments of the present invention will be described. In the following descriptions related to the drawings, the same or similar elements are denoted by the same or similar numerals. The drawings are exemplary, the dimensions and the shapes of elements are schematic, and the technical scope of the present invention is not limited to the embodiments.

First Embodiment

Figure 1:
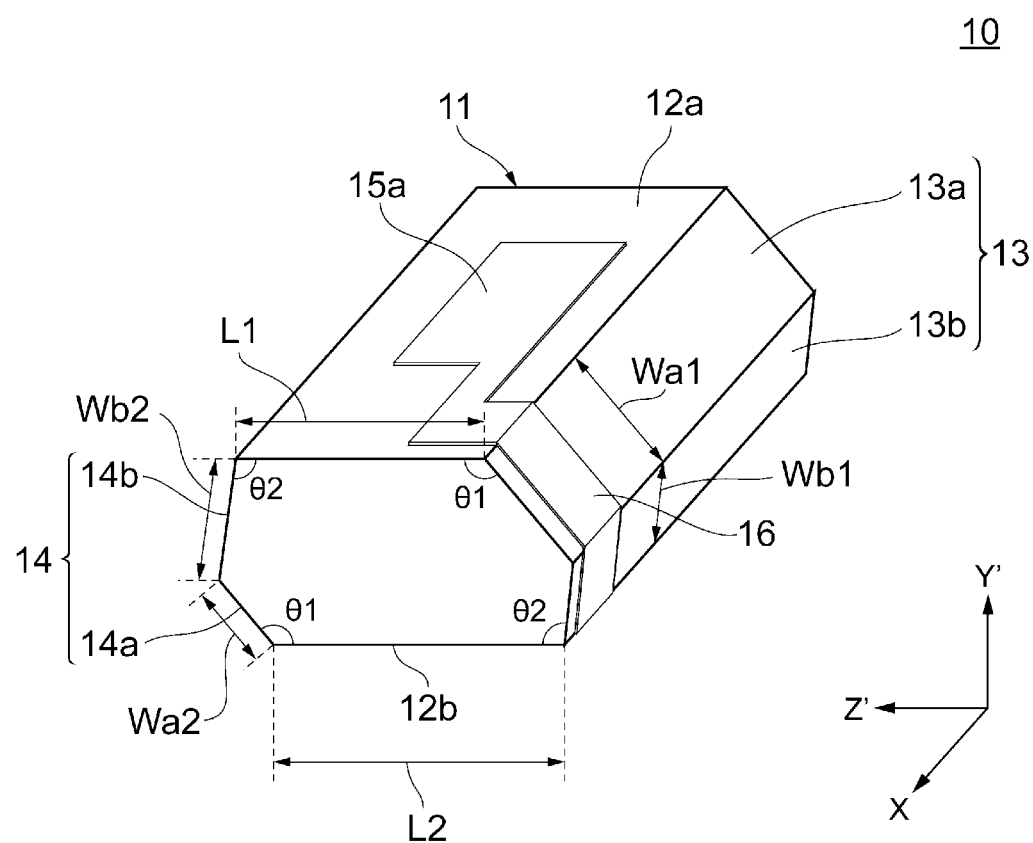
FIG. 1 is a perspective view of a quartz crystal resonator according to a first embodiment of the present invention as seen from one main surface side of a flat-plate-shaped quartz crystal blank.
Figure 2:
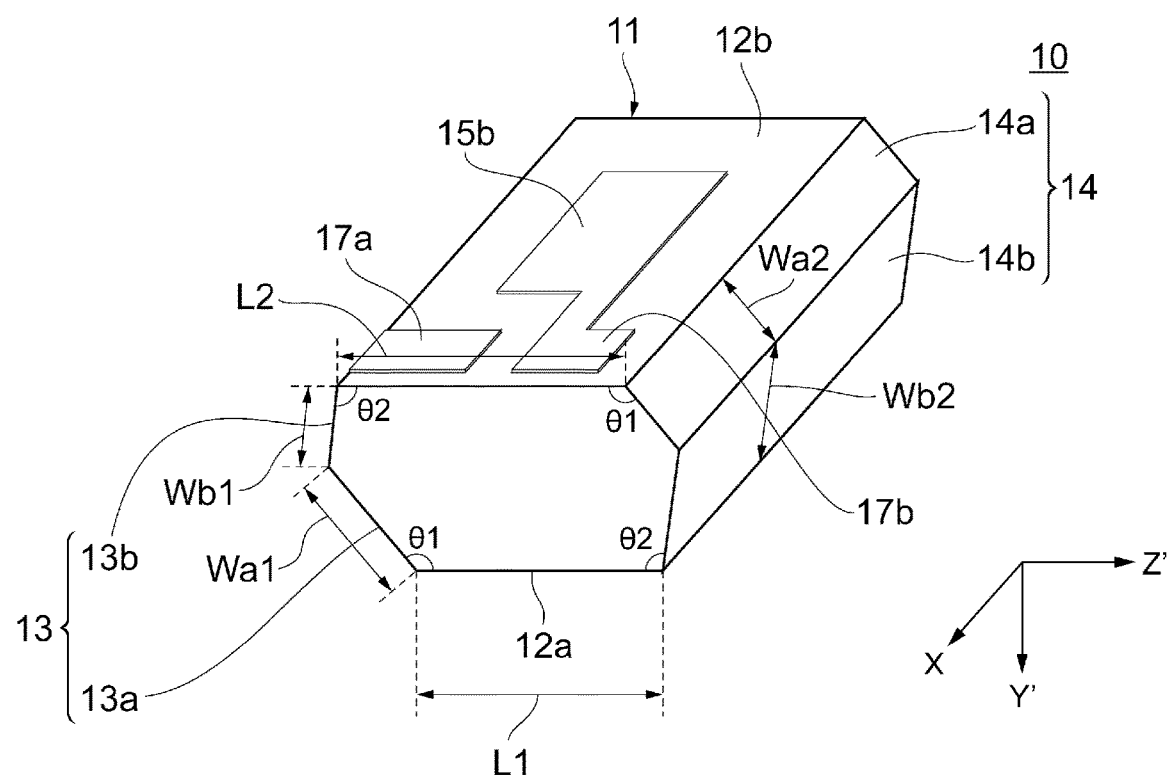
FIG. 2 is a perspective view of the quartz crystal resonator according to the first embodiment of the present invention as seen from the other main surface side of the flat-plate-shaped quartz crystal blank.
Figure 3:
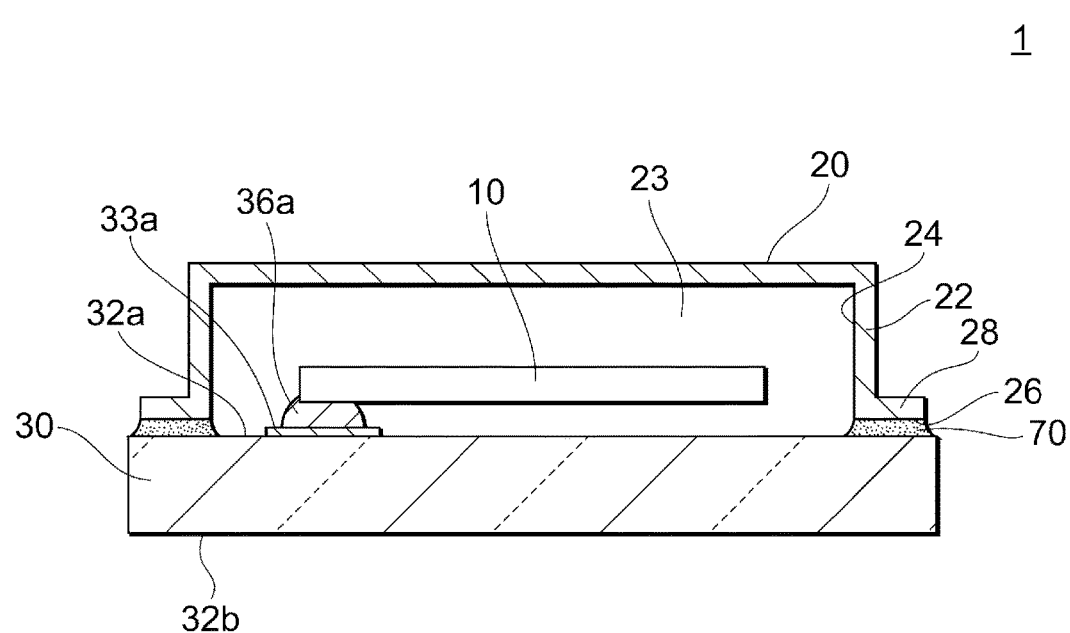
FIG. 3 is a sectional view of a quartz crystal resonator unit according to the first embodiment of the present invention.
Figure 4:
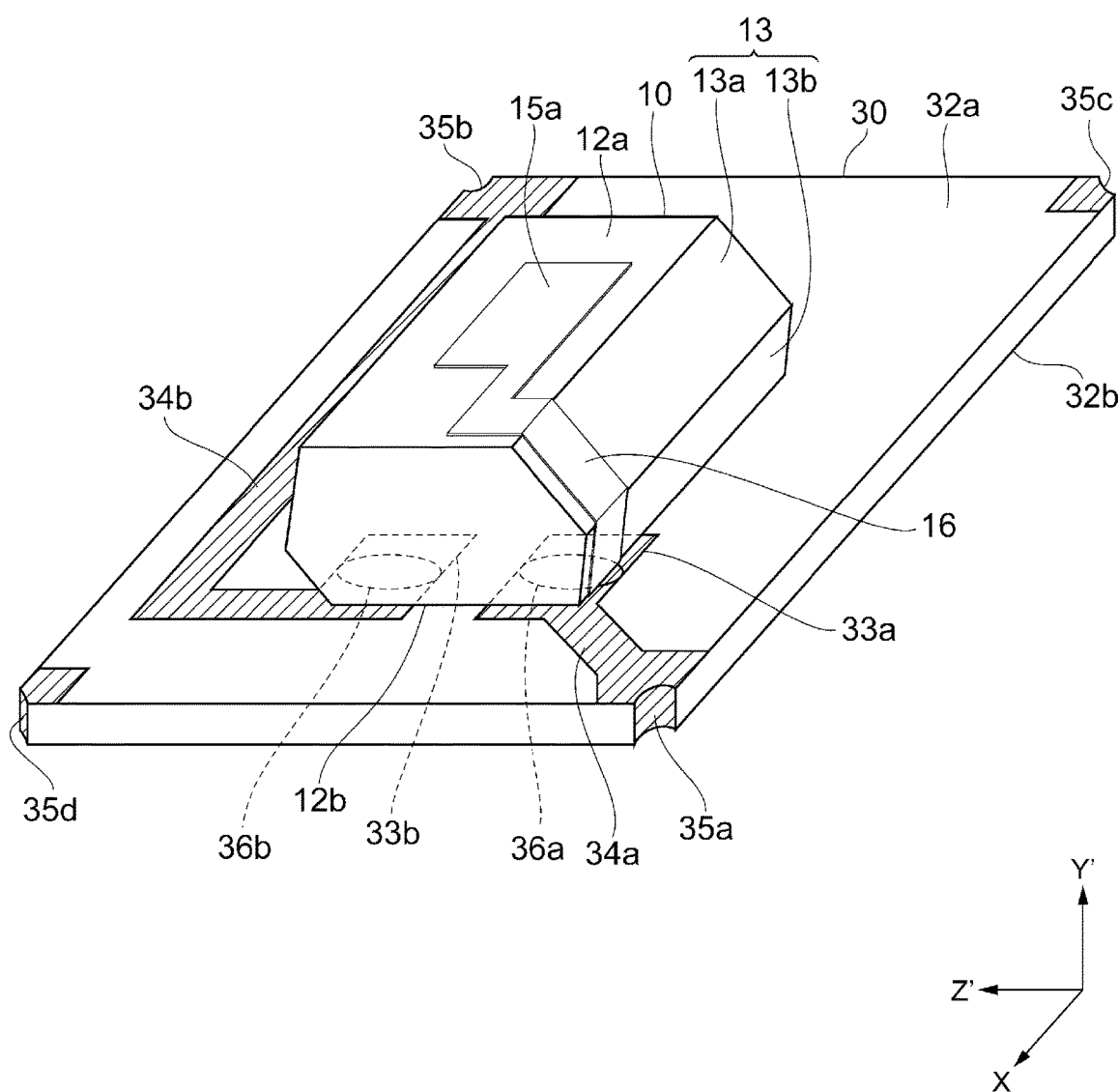
FIG. 4 is a perspective view of the quartz crystal resonator unit according to the first embodiment of the present invention (from which a lid member is omitted).

Referring to FIGS. 1 to 4, a quartz crystal resonator according to a first embodiment of the present invention and a quartz crystal resonator unit including the quartz crystal resonator will be described. Here, FIG. 1 is a perspective view of the quartz crystal resonator as seen from a first main surface side of a quartz crystal blank, and FIG. 2 is a perspective view of the quartz crystal resonator as seen from a second main surface side of the quartz crystal blank, which is the reverse side of FIG. 1. FIG. 3 is a sectional view of the quartz crystal resonator unit. FIG. 4 is a perspective view of the quartz crystal resonator unit, from which a lid member is omitted.

As illustrated in FIG. 3, a quartz crystal resonator unit 1 according to the present embodiment includes a quartz crystal resonator 10, a lid member 20, and a base member 30. The lid member 20 and the base member 30 constitute a holder for containing the quartz crystal resonator 10. In the present embodiment, for example, the lid member 20 has a cap-like shape and the base member 30 has a flat plate-like shape. However, the shapes of the lid member 20 and the base member 30 are not limited to these shapes.

As illustrated in FIGS. 1 and 2, the quartz crystal resonator 10 includes an AT-cut quartz crystal blank 11. The AT-cut quartz crystal blank 11 is cut out so that, when an X-axis, a Y-axis, and a Z-axis are the crystal axes of a synthetic quartz crystal and a Y'-axis and a Z'-axis are respectively axes that are obtained by rotating the Y-axis and the Z-axis around the X-axis by 35 degrees 15 minutes±1 minute 30 seconds in a direction from the Y-axis toward the Z-axis, the quartz crystal blank 11 has a main surface that is a surface parallel to a plane defined by the X-axis and the Z'-axis (hereinafter, referred to as the "XZ'-plane"). In the present embodiment, the quartz crystal blank 11, which is an AT-cut quartz crystal blank, has long sides that are parallel to the X-axis direction, short sides that are parallel to the Z' direction, and sides in a thickness direction parallel to the Y'-axis direction. The quartz crystal blank 11 has a rectangular shape in the XZ'-plane.

A quartz crystal resonator using an AT-cut quartz crystal blank has high frequency stability in a wide temperature range, has high durability, and can be manufactured at low cost. A thickness sheer mode is used as a main vibration of an AT-cut quartz crystal resonator. Hereinafter, elements of the quartz crystal resonator unit 1 will be described with reference to the axial directions of the AT-cut of a quartz crystal.

The quartz crystal blank 11 includes a first main surface 12a, a second main surface 12b, a first side surface 13, and a second side surface 14. The first main surface 12a and the second main surface 12b face each other. The first main surface 12a and the second main surface 12b each have long sides extending in the X-axis direction and short sides extending in the Z'-axis direction. The first side surface 13 and the second side surface 14 are side surfaces that are located adjacent to the long sides of the first main surface 12a and the second main surface 12b. In the present embodiment, the first main surface 12a and the second main surface 12b are each a flat surface, and the quartz crystal blank 11 has a flat plate-like shape having a uniform thickness in the Y'-axis direction. However, the present invention is not limited this. As described below, a mesa-shaped quartz crystal blank that has a non-uniform thickness in the Y'-axis direction may be used. The shape of the quartz crystal blank 11 will be described below in detail.

The quartz crystal resonator 10 includes a first excitation electrode 15a and a second excitation electrode 15b. The first excitation electrode 15a is formed on the first main surface 12a of the quartz crystal blank 11, and the second excitation electrode 15b is formed on the second main surface 12b of the quartz crystal blank 11. The first excitation electrode 15a and the second excitation electrode 15b are each placed in a region that includes the center of a corresponding one of the main surfaces, and are disposed so as to substantially overlap each other in the XZ'-plane as a pair of electrodes. The first excitation electrode 15a and the second excitation electrode 15b each have a rectangular shape that has long sides and short sides in the XZ'-plane. In the example illustrated in FIGS. 1 and 2, the orientation of the long sides of the first excitation electrode 15a and the second excitation electrode 15b coincides with the orientation of the long sides of the quartz crystal blank 11 (that is, the X-axis direction), and the orientation of the short sides of the first excitation electrode 15a and the second excitation electrode 15b coincides with the orientation of the short sides of the quartz crystal blank 11 (that is, the Z'-axis direction).

The quartz crystal resonator 10 includes an extension electrode 16 that is electrically connected to the first excitation electrode 15a, a first connection electrode 17a that is electrically connected to the first excitation electrode 15a via the extension electrode 16, and a second connection electrode 17b that is electrically connected to the second excitation electrode 15b. The first connection electrode 17a and the second connection electrode 17b are formed on the second main surface 12b of the quartz crystal blank 11, and, to be more specific, are disposed near one short side of the second main surface 12b (on the positive X-axis side) and are arranged in the short-side direction of the second main surface 12b. The extension electrode 16 is electrically connected to the first excitation electrode 15a on the first main surface 12a and extends from the first main surface 12a to the second main surface 12b along the first side surface 13. The extension electrode 16, which extends from the front surface to the back surface of the quartz crystal blank 11 in this way, can electrically connect the first excitation electrode 15a formed on the first main surface 12a and the first connection electrode 17a formed on the second main surface 12b. The first connection electrode 17a and the second connection electrode 17b are electrically connected to electrodes of the base member 30 via electroconductive holding members 36a and 36b. The electroconductive holding members 36a and 36b may be formed by thermally curing an electroconductive adhesive.

The materials of the first excitation electrode 15a, the second excitation electrode 15b, the extension electrode 16, and the connection electrodes 17a and 17b are not particularly limited. For example, these electrodes each may have a chrome (Cr) underlying layer and a gold (Au) layer on the chrome layer.

As illustrated in FIG. 3, the lid member 20 has a recess 24 that has an opening that faces a first main surface 32a of the base member 30. A side wall 22, which stands on the bottom surface of the recess 24, is formed along the entire periphery of the recess 24. The lid member 20 has a facing surface 26 that is located at the opening edge of the recess 24 and that faces the first main surface 32a of the base member 30. The lid member 20 may further include a flange portion 28 that protrudes outward from the side wall 22. In this case, the flange portion 28 has the facing surface 26. With this structure, the flange portion 28 and the base member 30 can be joined to each other over a large area, and therefore the joining strength between these can be increased.

In the present embodiment, the shape of the lid member 20 is not particularly limited. For example, the lid member 20 may have substantially the same planar shape as the base member 30 so that the lid member 20 and the base member 30 can constitute a holder for containing the quartz crystal resonator 10. In the example illustrated in FIG. 2, the lid member 20 includes the flange portion. However, this is not a limitation. The flange portion 28 may be omitted, and the edge of the side wall 22, which stands substantially perpendicularly on the bottom surface of the recess 24, may be joined to the base member 30.

The material of the lid member 20 is not particularly limited. For example, the material may be an electroconductive material such as a metal. In this case, by electrically connecting the lid member 20 to a ground potential, the lid member 20 can additionally have a shielding function. Alternatively, the lid member 20 may be made of an insulating material or may have a composite structure made of an electroconductive material and an insulating material.

The base member 30 supports the quartz crystal resonator 10 in such a way that the quartz crystal resonator 10 is excitable. To be specific, the quartz crystal resonator 10 is supported on the first main surface 32a of the base member 30 via the electroconductive holding members 36a and 36b in such a way that the quartz crystal resonator 10 is excitable.

As illustrated in FIG. 4, the base member 30 has a longitudinal direction parallel to the Z'-axis direction, a transversal direction parallel to the X-axis direction, and a thickness direction parallel to the Y'-axis direction. The base member 30 has a rectangular shape in the XZ'-plane. That is, the first main surface 32a and a second main surface 32b of the base member 30 each have long sides extending in the X-axis direction and short sides extending in the Z'-axis direction.

The base member 30 may be made of, for example, an insulating ceramic. For example, the base member 30 may be made by stacking and firing a plurality of insulating ceramic sheets. Alternatively, the base member 30 may be made of a glass material (such as silicate glass, or a material that is mainly composed of a substance other than silicate glass and that exhibits a glass transition phenomenon due to increase in temperature), a quartz crystal material (such as an AT-cut quartz crystal), a glass epoxy resin, or the like. Preferably, the base member 30 is made of a heat resistant material. The base member 30 may have a single layer or multiple layers. If the base member 30 has multiple layers, the layers may include an insulating layer formed as an outermost layer at the first main surface 32a. The base member 30 has a flat plate-like shape.

As illustrated in FIG. 3, because the lid member 20 and the base member 30 are joined to each other via a joining material 70, the quartz crystal resonator 10 is hermetically sealed in an inner space (cavity) 23 that is surrounded by the recess 24 of the lid member 20 and the base member 30. In this case, preferably, pressure in the inner space is in a vacuum state in which the pressure is lower than the atmospheric pressure, because ageing of the excitation electrodes 15a and 15b due to oxidation and the like can be reduced.

The joining material 70 is placed along the entire periphery of each of the lid member 20 and the base member 30 and is present between the facing surface 26 of the side wall 22 of the lid member 20 and the first main surface 32a of the base member 30. The joining material 70 includes an insulating material. The insulating material may be a glass adhesive material, such as a low-melting-point glass (for example, a lead borate glass or a tin phosphate glass), or a resin adhesive. With these insulating materials, the cost is lower than metal junction, and it is possible to lower the heating temperature and to simplify the manufacturing process.

In the present embodiment, one end of the quartz crystal resonator 10 in the longitudinal direction (an end portion adjacent to the electroconductive holding members 36a and 36b) is a fixed and, and the other end of the quartz crystal resonator 10 is a free end. The quartz crystal resonator 10, the lid member 20, and the base member 30 each have a rectangular shape in the XZ'-plane and are disposed in orientations such that the longitudinal directions and the transversal directions thereof coincide with each other.

The position of the fixed end of the quartz crystal resonator 10 is not particularly limited. As a modification, the quartz crystal resonator 10 may be fixed to the base member 30 at both ends thereof in the longitudinal direction. In this case, electrodes of the quartz crystal resonator 10 and the base member 30 may be formed so that the quartz crystal resonator 10 can be fixed at both ends thereof in the longitudinal direction.

As illustrated in FIG. 4, the base member 30 includes connection electrodes 33a and 33b that are formed on the first main surface 32a; extension electrodes 34a and 34b that are formed on the first main surface 32a and that are electrically connected to the connection electrodes 33a and 33b; and outer electrodes 35a, 35b, 35c, and 35d for electrically connecting the base member 30 to a mounting board (not shown) at the second main surface 32b.

The connection electrodes 33a and 33b of the base member 30 are disposed near one short side of the first main surface 32a (on the positive X-axis side) and are arranged in the short-side direction of the first main surface 32a. The first connection electrode 17a of the quartz crystal resonator 10 is connected to the connection electrode 33a via the electroconductive holding member 36a. The second connection electrode 17b of the quartz crystal resonator 10 is connected to the connection electrode 33b via the electroconductive holding member 36b.

The plurality of outer electrodes 35a, 35b, 35c, and 35d are formed at corners of the base member 30. To be specific, the outer electrode 35a is formed at a corner on the positive X-axis side and the negative Z'-axis side, the outer electrode 35b is formed at a corner on the negative X-axis side and the positive Z'-axis side, the outer electrode 35c is formed at a corner on the negative X-axis side and the negative Z'-axis side, and the outer electrode 35d is formed at a corner on the positive X-axis side and positive Z'-axis side.

Among the plurality of outer electrodes 35a to 35d, the outer electrode 35a is electrically connected to the connection electrode 33a via the extension electrode 34a, and the outer electrode 35b is electrically connected to the connection electrode 33b via the extension electrode 34b. That is, the outer electrodes 35a and 35b are input/output terminals that are electrically connected to the first excitation electrode 15a and the second excitation electrode 15b. As illustrated in FIG. 4, the outer electrodes 35a and 35b are disposed at opposite corners of the first main surface 32a of the base member 30.

The remaining outer electrodes 35c and 35d are disposed at opposite corners of the first main surface 32a of the base member 30. These outer electrodes are dummy electrodes that are not electrically connected to the first excitation electrode 15a and the second excitation electrode 15b of the quartz crystal resonator 10. As described above, because the outer electrodes are disposed at all corners of the base member 30 so that the outer electrodes are present in any directions of the base member 30 in plan view, it is easy to apply an electroconductive material for forming outer electrodes and to mount the quartz crystal resonator unit 1 on a mounting board.

The dummy electrodes may be electrically connected to terminals that are disposed on a mounting board (not shown) on which the quartz crystal resonator unit 1 is mounted and that are not connected to any electronic elements mounted on the mounting board. In a case where the lid member 20 is made of an electroconductive material, the lid member 20 can additionally have a shielding function. Here, the outer electrodes 35c and 35d, which are dummy electrodes, may be ground electrodes to which a ground potential is supplied.

In this case, it is possible to improve the shielding function by electrically connecting the lid member 20, which is made of an electroconductive material, to the outer electrodes 35c and 35d.

In the example illustrated in FIG. 4, each of the corners of the base member 30 has a cutout side surface that is formed by partially cutting out the corner in a cylindrically curved shape (also referred to as a castellation shape). The outer electrodes 35a to 35d are each formed continuously on the cutout side surface and the second main surface 32b. The shape of each of the corners of the base member 30 is not limited to this shape. Each of the corners may be cut out so as to have a planar shape, or may have a rectangular shape with four right-angled corners without being cut out in plan view.

The structures of the connection electrodes 33a and 33b, the extension electrodes 34a and 34b, and the outer electrodes 35a to 35d of the base member 30 are not limited to those of the examples described above, and may be modified in various ways. For example, the connection electrodes 33a and 33b may be disposed at different end portions on the first main surface 32a of the base member 30, such as both ends in the long-side direction. With such a structure, the quartz crystal resonator 10 is supported by the base member 30 at both of one end and the other end thereof in the longitudinal direction. The number of outer electrodes is not limited to four, and only two outer electrodes, which are input/output terminals, may be disposed at diagonally opposite positions. Outer electrodes need not be disposed at corners, and may be formed on any of the side surfaces of the base member 30 excluding the corners. In this case, cutout side surfaces may be formed by partially cutting out the side surfaces so as to form cylindrically-curved surfaces as described above, and the outer electrodes may be formed on the side surfaces excluding the corners. The other outer electrodes 35c and 35d, which are dummy electrodes, need not be formed. Through-holes may be formed so as to extend through the base member 30 from the first main surface 32a to the second main surface 32b, and connection electrodes formed on the first main surface 32a may be electrically connected to the second main surface 32b via the through-holes.

In the quartz crystal resonator unit 1 according to the present embodiment, an alternating electric field is applied between the pair of first excitation electrode 15a and the second excitation electrode 15b of the quartz crystal resonator 10 via the outer electrodes 35a and 35b of the base member 30. Thus, the quartz crystal blank 11 vibrates in a thickness shear mode, and resonance characteristics due to the vibration are obtained.

Next, referring back to FIGS. 1 and 2, the shape of the quartz crystal blank 11 according to the present embodiment will be described in detail.

The first side surface 13 of the quartz crystal blank 11 adjacent to long sides is composed of an m-plane face 13a that abuts on a long side of the first main surface 12a at an angle θ1 and a non-m-plane face 13b that abuts on a long side of the second main surface 12b at an angle θ2. That is, the m-plane face 13a and the non-m-plane face 13b are two surfaces that are continuous and that have different inclination angles. The term "m-plane" refers to a natural plane of a quartz crystal, and the term "non-m-plane" refers to a plane of the quartz crystal other than the m-plane. The m-plane face 13a is a first m-plane face, and the non-m-plane face 13b is a first non-m-plane face.

The second side surface 14 of the quartz crystal blank 11 adjacent to long sides is composed of a non-m-plane face 14b that abuts on a long side of the first main surface 12a at the angle θ2 and an m-plane face 14a that abuts on a long side of the second main surface 12b at the angle θ1. That is, the m-plane face 14a and the non-m-plane face 14b are two surfaces that are continuous and that have different inclination angles. The m-plane face 14a is a second m-plane face, and the non-m-plane face 14b is a second non-m-plane face.

The angle θ2, at which each of the non-m-plane faces 13b and 14b abuts on a corresponding main surface, is about 93 degrees (that is, about 3 degrees from a direction normal to the main surface). To be more specific, in consideration of processing accuracy and the like, the angle θ2 is about 93±2 degrees (that is, about 3±2 degrees from the direction normal to the main surface). Thus, the non-m-plane faces 13b and 14b are side surfaces that abut on the corresponding main surfaces substantially perpendicularly.

The angle θ1, at which each of the m-plane faces 13a and 14a abuts on a corresponding main surface, is an obtuse angle larger than 90 degrees. To be specific, in consideration of processing accuracy and the like, the angle θ2 is about 144±2 degrees. That is, the angles θ1 and θ2 have a relationship θ1>θ2. Thus, the m-plane faces 13a and 14a are side surfaces whose inclination angles from the corresponding main surfaces are gentler than those of the non-m-plane faces 13b and 14b.

As illustrated in FIGS. 1 and 2, the positions of the m-plane face 13a and the non-m-plane face 13b of the first side surface 13 are point-symmetric to the positions of the m-plane face 14a and the non-m-plane face 14b of the second side surface 14 about a central point on a side surface of the quartz crystal blank 11 in the Y'Z'-plane (that is, a side surface adjacent to short sides of the quartz crystal blank 11). However, the sizes of the m-plane face 13a and the m-plane face 14a (or the sizes of the non-m-plane face 13b and the non-m-plane face 14b) differ from each other. To be specific, in a width direction perpendicular to the long sides of the first side surface 13 and the second side surface 14 in the X-axis direction, the width Wa1 of the m-plane face 13a of the first side surface 13 and the width Wa2 of the m-plane face 14a of the second side surface 14 have a relationship Wa1>Wa2. In accordance with the relationship between the sizes of the m-plane faces, the width Wb1 of the non-m-plane face 13b of the first side surface 13 and the width Wb2 of the non-m-plane face 14b of the second side surface 14 satisfy a relationship Wb1<Wb2.

Thus, in the present embodiment, the first side surface 13 is a side surface along which the extension electrode 16 extends from the front main surface to the back main surface of the quartz crystal blank 11; and the width ratio (the area ratio), which is the ratio of a portion having a gentler inclination angle from a main surface, of the first side surface 13 is larger than that in the second side surface 14. That is, the widths have a relationship Wa1/Wb1>Wa2/Wb2. Therefore, in the first side surface 13 on which the extension electrode 16 is to be formed, the width Wa1 of the m-plane face 13a, on which it is easy to form an electrode, can be increased, and the width Wb1 of the non-m-plane face 13b, on which it is difficult to form an electrode, can be reduced. Accordingly, it is easy to form the extension electrode 16, which extends from the front main surface to the back main surface of the quartz crystal blank 11, and it is possible to prevent breakage of the extension electrode 16.

In the present embodiment, the length L1 of the short sides of the first main surface 12a and the length L2 of the short sides of the second main surface 12b have a relationship L1<L2. Accordingly, when the quartz crystal blank 11 is seen in the XZ'-plane, it is easy to distinguish between the front surface and the back surface of the quartz crystal blank 11. Thus, it is possible to increase the efficiency in assembling and handling the quartz crystal resonator unit 1.

The length L2 of the short sides of the second main surface 12b, on which the first connection electrode 17a and the second connection electrode 17b are disposed, is large. Therefore, it is possible to separate the first connection electrode 17a and the second connection electrode 17b, which are disposed along a short side of the second main surface 12b, by a large distance, while maintaining the small size of the quartz crystal blank 11. Accordingly, it is easy to prevent a short circuit between the first connection electrode 17a and the second connection electrode 17b.

The electroconductive holding members 36a and 36b, which are disposed between the quartz crystal resonator 10 and the base member 30, are wettable to an electrode material formed on the quartz crystal blank 11. Therefore, the electrode material may spread along the extension electrode 16 to a side surface of the quartz crystal blank 11. In this regard, in the present embodiment, a surface that is included in the first side surface 13, on which the extension electrode 16 is formed, and that abuts on a long side of the second main surface 12b is the non-m-plane face 13b, which is substantially perpendicular. Therefore, it is possible to reduce the amount of the electroconductive adhesive for forming the electroconductive holding members 36a and 36b that spreads along the extension electrode 16. Accordingly, it is possible to reduce inhibition of vibration of the quartz crystal resonator 10 due to spreading of the electroconductive adhesive.

Because the first side surface 13 and the second side surface 14 of the quartz crystal blank 11 have non-m-plane faces that abut on the main surfaces at the angle θ2 (about 93 degrees±2 degrees), coupling of a width shear mode and a thickness shear mode can be reduced, compared with a case where the inclination angle of the side surfaces is 90 degrees. Accordingly, it is also possible to improve frequency-temperature characteristics in addition to an energy confinement effect.

Figure 5:
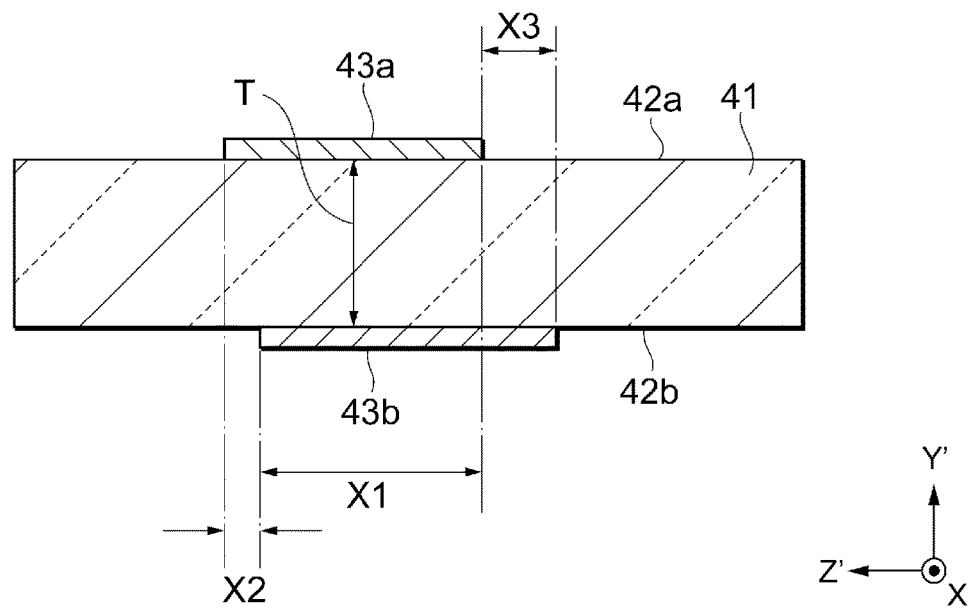
FIG. 5 illustrates a method of manufacturing a quartz crystal blank according to the first embodiment of the present invention.
Figure 6:
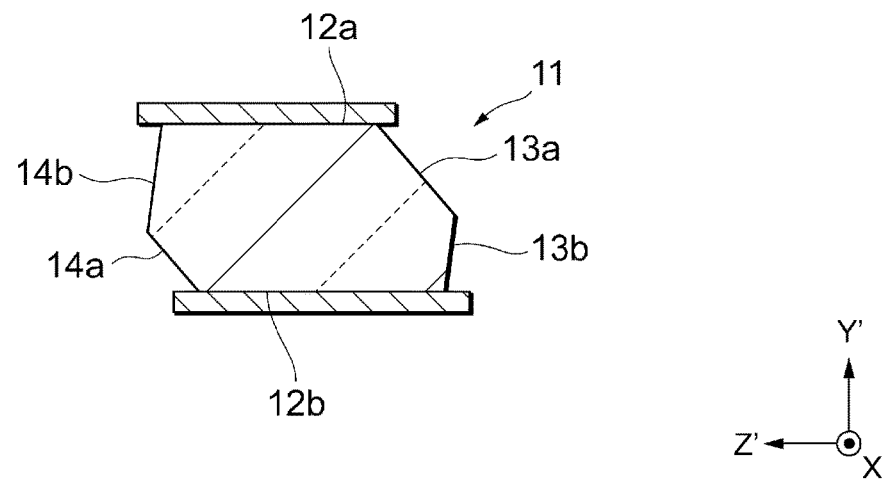
FIG. 6 illustrates the method of manufacturing the quartz crystal blank according to the first embodiment of the present invention.

FIGS. 5 and 6 illustrate a method of manufacturing a quartz crystal blank according to the present embodiment. The shape of the quartz crystal blank according to the present embodiment can be formed, for example, by wet etching.

First, as illustrated in FIG. 5, a quartz crystal substrate 41 having a first main surface 42a and a second main surface 42b that face each other is prepared. Here, the first main surface 42a and the second main surface 42b are surfaces each which extends in the X-axis direction and the Z'-axis direction of a quartz crystal. Next, a first mask 43a and a second mask 43b are respectively placed on the first main surface 42a and the second main surface 42b, which are the front and back surfaces of the quartz crystal substrate 41. The first mask 43a and the second mask 43b are each, for example, a metal mask made of a metal material.

In the step of placing the masks 43a and 43b, for example, a metal film is formed on the entire area of the first main surface 42a of the quartz crystal substrate 41 by sputtering, and then opening portions of the first mask 43a are etched away to obtain a predetermined shape. By using the same method, the second mask 43b is placed on the second main surface 42b of the quartz crystal substrate 41. The first main surface 42a and the second main surface 42b of the quartz crystal substrate 41 respectively correspond to the first main surface 12a and the second main surface 12b of the quartz crystal blank 11 illustrated in FIG. 1.

The first mask 43a and the second mask 43b, which are formed in such a way that substantially the entireties thereof overlap when the XZ'-plane face is viewed in plan. However, in order to form the m-plane faces 13a and 14a and the non-m-plane faces 13b and 14b, which have widths that differ from each other, the first mask 43a and the second mask 43b are disposed so as to be displaced from each other in the Z'-axis direction. In other words, the masks 43a and 43b are placed in such a way that a part of the mask 43a on the first main surface 42a overlaps a part of the mask 43b on the second main surface 42b. To be more specific, for example, the first mask 43a and the second mask 43b are placed so as to overlap each other by a first distance X1 in the Z'-axis direction, the first mask 43a is placed so as to be displaced from the second mask 43b by a second distance X2 in the positive Z'-axis direction, and the second mask 43b is placed so as to be displaced from the first mask 43a by a third distance X3 in the negative Z'-axis direction. Here, the lengths of the first distance X1, the second distance X2, and the third distance X3 depend on the processing time and the processing method of wet etching. For example, when the thickness of a vibration portion of the quartz crystal blank 11, which is sandwiched between the first excitation electrode 15a and the second excitation electrode 15b, is denoted by T, preferably, relationships X2<X3, 0.4T<X2≤0.75T, and 0.75T<X3≤2T are satisfied.

Next, the quartz crystal substrate 41, on which the first mask 43a and the second mask 43b have been formed, is wet etched. For example, the quartz crystal substrate 41 is wet etched simultaneously from both surfaces by using an ammonium fluoride solution or the like. Thus, as illustrated in FIG. 6, the quartz crystal blank 11 having the first side surface 13 and the second side surface 14 can be formed.

Thus, it is possible to form the m-plane face 13a that has a larger width than the m-plane face 14a in accordance with the lengths of X2 and X3. Moreover, it is possible to form the first main surface 12a in accordance with a length of (X1+X2) and to form the second main surface 12b that has short sides longer than those of the first main surface 12a in accordance with a length of (X1+X3).

In the method described above, the masks 43a and 43b are simultaneously formed on both surfaces of the quartz crystal substrate 41, and the quartz crystal substrate 41 is wet etched simultaneously from both surfaces. However, this is not a limitation. The mask 43a may be formed on one surface of the quartz crystal substrate 41 and then wet etching may be performed, and next, the mask 43b may be formed on the other surface of the quartz crystal substrate 41 and wet etching may be performed. In this case, it is possible to wet etch the first main surface 42a and the second main surface 42b for different processing times, and therefore the quartz crystal blank 11 according to the present embodiment can be more easily formed.

Second Embodiment

Figure 7:
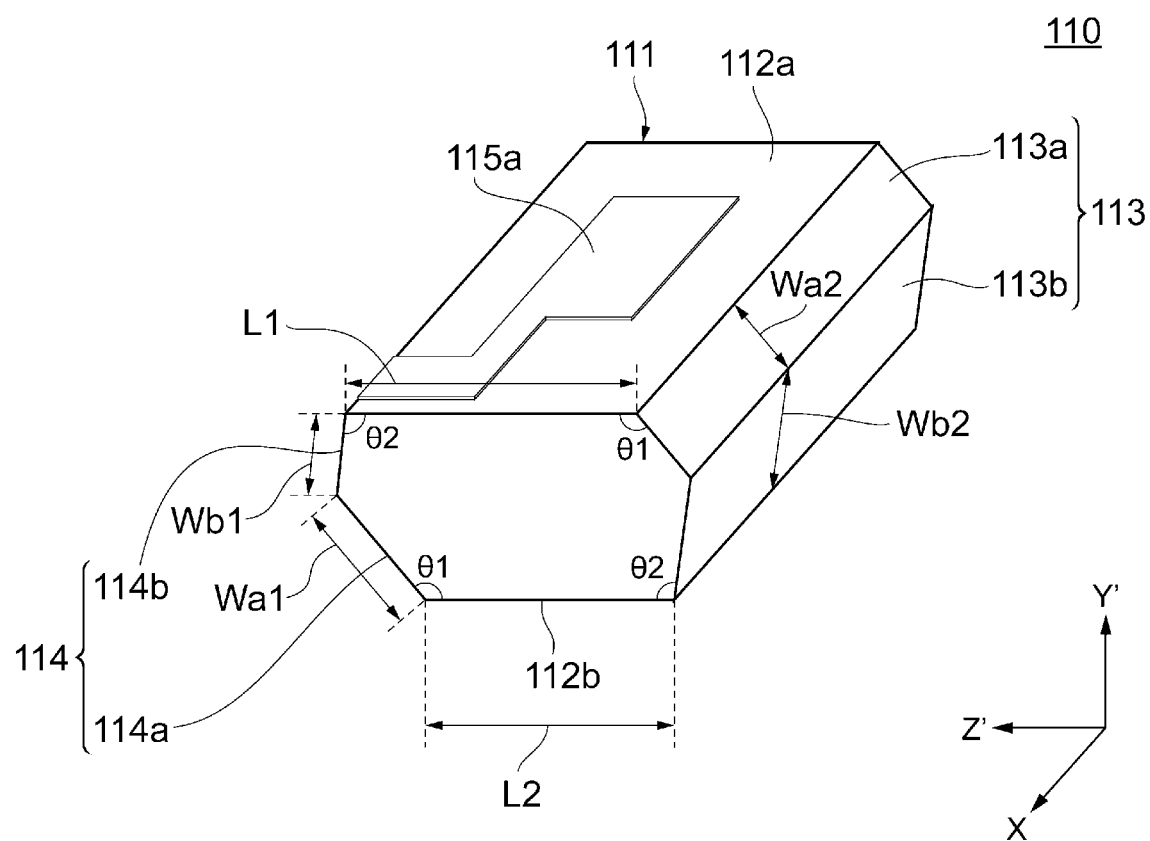
FIG. 7 is a perspective view of a quartz crystal resonator according to a second embodiment of the present invention as seen from one main surface side of a flat-plate-shaped quartz crystal blank.
Figure 8:
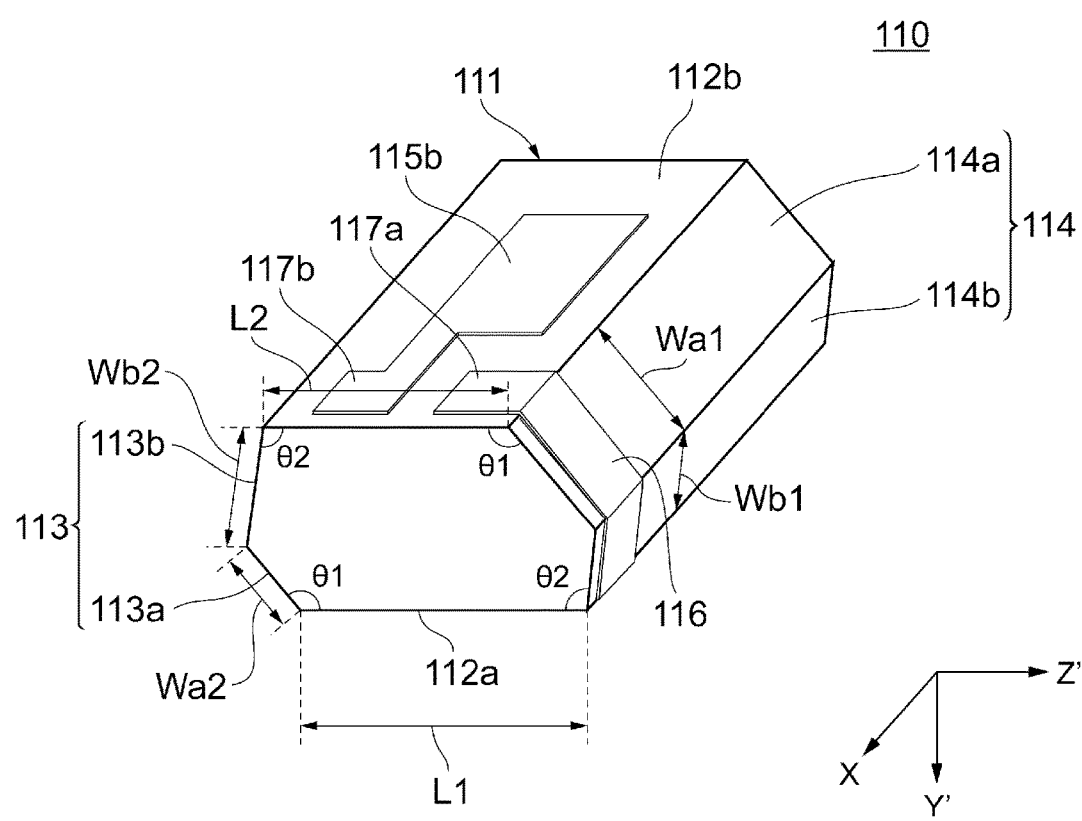
FIG. 8 is a perspective view of the quartz crystal resonator according to the second embodiment of the present invention as seen from the other main surface side of the flat-plate-shaped quartz crystal blank.
Figure 9:
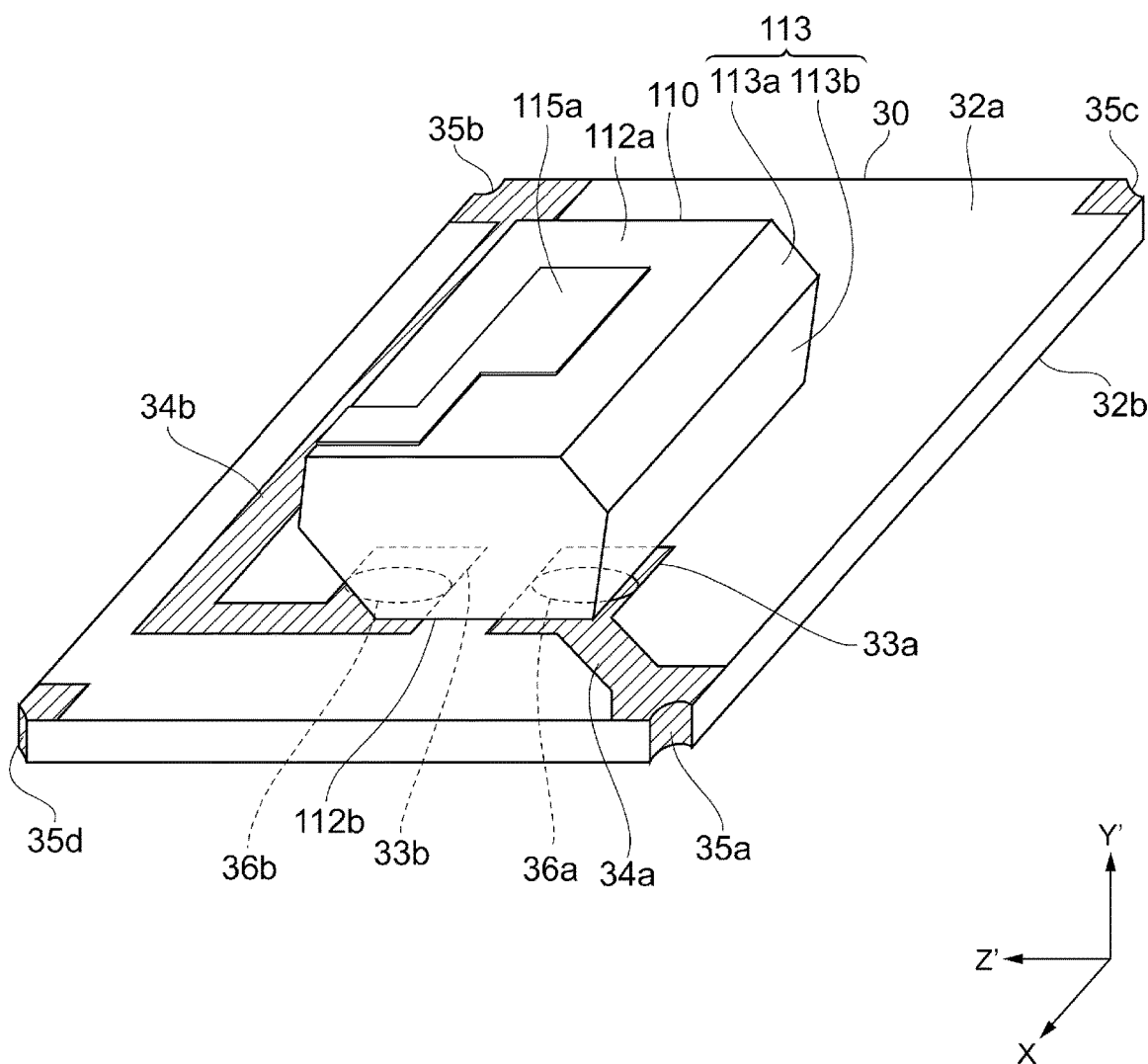
FIG. 9 is a perspective view of the quartz crystal resonator unit according to the second embodiment of the present invention (from which a lid member is omitted).

Next, referring to FIGS. 7 to 9, a quartz crystal resonator according to a second embodiment of the present invention and a quartz crystal resonator unit including the quartz crystal resonator will be described. Here, FIG. 7 is a perspective view of the quartz crystal resonator as seen from a first main surface side of a quartz crystal blank, and FIG. 8 is a perspective view of the quartz crystal resonator as seen from a second main surface side of the quartz crystal blank, which is the reverse side of FIG. 7. FIG. 9 is a perspective view of the quartz crystal resonator unit, from which a lid member is omitted. Elements that are the same as those of the first embodiment are denoted by the same numerals.

A quartz crystal resonator 110 according to the present embodiment is the same as the first embodiment in the shape of a quartz crystal blank 111 and the structure of the base member 30 and differs from the first embodiment in the structures of connection electrodes and an extension electrode formed on the quartz crystal blank 111. That is, in the present embodiment, the three-dimensional shape of the quartz crystal blank is the same as that of the first embodiment, but a side surface along which the extension electrode extends differs from the side surface in the first embodiment. Accordingly, a main surface on which the connection electrodes are disposed is opposite to the main surface in the first embodiment. Hereinafter, differences from the first embodiment will be described. In the present embodiment, for convenience of description, as in the first embodiment, a main surface on which the connection electrode are not disposed will be referred to as a first main surface, and a main surface on which the connection electrodes are disposed will be referred to as a second main surface.

As illustrated in FIGS. 7 and 8, in the present embodiment, a first excitation electrode 115a is formed on a first main surface 112a of the quartz crystal blank 111, a second excitation electrode 115b is formed on a second main surface 112b of the quartz crystal blank 111, and a first connection electrode 117a and a second connection electrode 117b are formed on the second main surface 112b of the quartz crystal blank 111. To be more specific, the first connection electrode 117a and the second connection electrode 117b are disposed near one short side of the second main surface 112b (on the positive X-axis side) and are arranged in the short-side direction of the second main surface 112b. An extension electrode 116 is electrically connected to the first excitation electrode 115a on the first main surface 112a and extends from the first main surface 112a to the second main surface 112b along a second side surface 114. The extension electrode 116, which extends from the front surface to the back surface of the quartz crystal blank 111 in this way, can electrically connect the first excitation electrode 115a formed on the first main surface 112a and the first connection electrode 117a formed on the second main surface 112b. The second connection electrode 117b is electrically connected to the second excitation electrode 115b formed on the second main surface 112b. The first connection electrode 117a and the second connection electrode 117b are electrically connected to the connection electrodes 33a and 33b of the base member 30 via the electroconductive holding members 36a and 36b.

In the present embodiment, the second side surface 114 is a side surface along which the extension electrode 116 extends from the front main surface to the back main surface of the quartz crystal blank 111; and, as in the first embodiment, the width ratio (the area ratio), which is the ratio of a portion having a gentler inclination angle from a main surface, of the second side surface 114 is larger than that of a first side surface 113. That is, the widths have a relationship Wa1/Wb1>Wa2/Wb2. Therefore, in the second side surface 114 on which the extension electrode 116 is to be formed, the width Wa1 of an m-plane face 114a, on which it is easy to form an electrode, can be increased, and the width Wb1 of a non-m-plane face 114b, on which it is difficult to form an electrode, can be reduced. Accordingly, it is easy to form the extension electrode 116, which extends from the front main surface to the back main surface of the quartz crystal blank 111, and it is possible to prevent breakage of the extension electrode 116.

In the present embodiment, a surface that is included in the second side surface 114, on which the extension electrode 116 is formed, and that abuts on a long side of the second main surface 112b is the m-plane face 114a, which is a gently inclined surface, and the width of the m-plane face 114a is large. Therefore, it is possible to increase the amount of an electroconductive adhesive, for forming the electroconductive holding members 36a and 36b, that spreads along the extension electrode 116. Accordingly, it is possible to increase a bonding area of the electroconductive adhesive and thus to increase the holding strength by the electroconductive holding members 36a and 36b.

Regarding the other structures and the advantageous effects of the quartz crystal resonator unit and the quartz crystal resonator, the contents of description in the first embodiment can be used. A method of manufacturing the quartz crystal blank 111 is the same as that described above.

Third Embodiment

Figure 10:
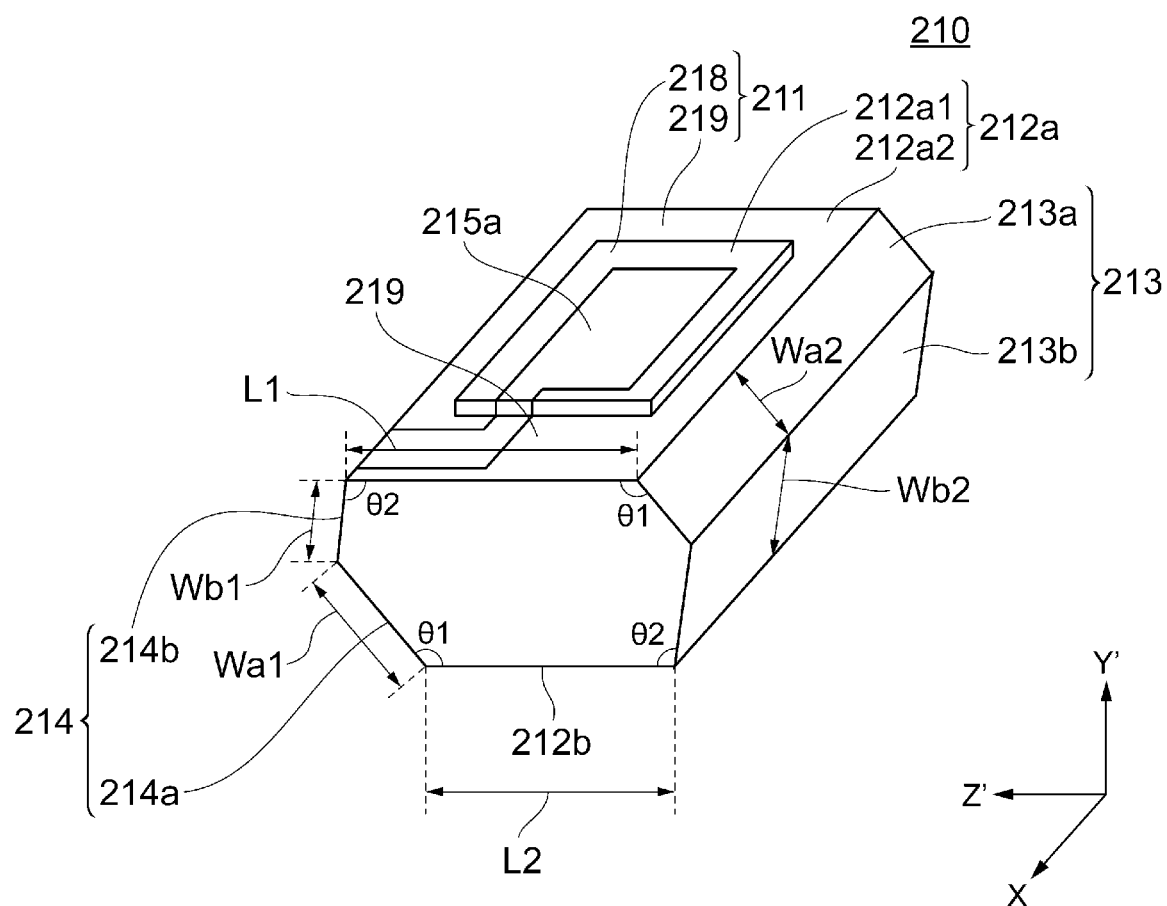
FIG. 10 is a perspective view of a quartz crystal resonator according to a third embodiment of the present invention as seen from one main surface side of a mesa-shaped quartz crystal blank.
Figure 11:
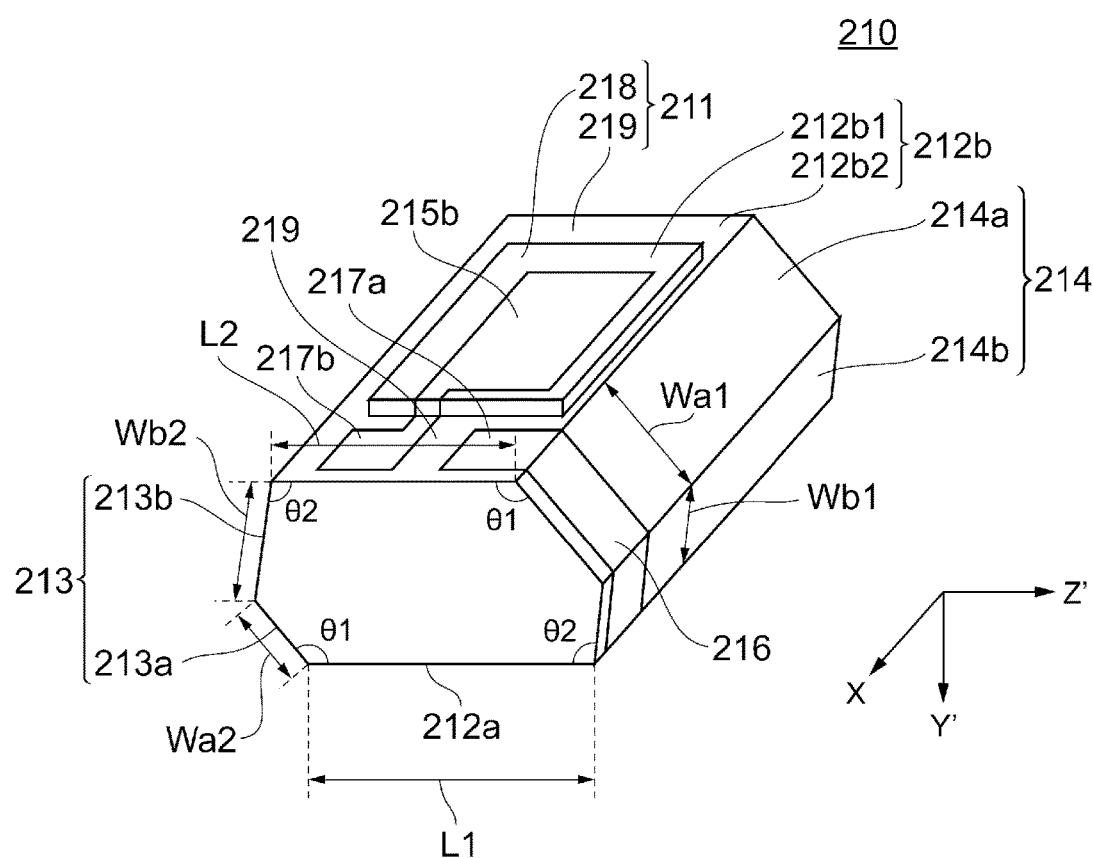
FIG. 11 is a perspective view of the quartz crystal resonator according to the third embodiment of the present invention as seen from the other main surface side of the mesa-shaped quartz crystal blank.

Next, referring to FIGS. 10 and 11, a quartz crystal resonator according to a third embodiment of the present invention will be described. Here, FIG. 10 is a perspective view of the quartz crystal resonator as seen from a first main surface side of a quartz crystal blank, and FIG. 11 is a perspective view of the quartz crystal resonator as seen from a second main surface side of the quartz crystal blank, which is the reverse side of FIG. 10.

A quartz crystal resonator 210 according to the present embodiment differs from the first and second embodiments in the shape of a quartz crystal blank 211. That is, in the present embodiment, the quartz crystal blank 211 has a mesa shape. To be specific, the AT-cut quartz crystal blank 211 includes a first portion 218 that includes the centers of a first main surface 212a and a second main surface 212b and a second portion 219 that is adjacent to both ends of the first portion 218 in the X-axis direction, and the thickness of the second portion 219 in the Y'-axis direction is smaller than the thickness of the first portion 218 in the Y'-axis direction. In this case, the first portion 218 may be referred to as a thick middle portion and the second portion 219 may be referred to as a thin peripheral portion. In the present embodiment, the first main surface 212a is composed of a first main surface 212a1 of the first portion 218 and a first main surface 212a2 of the second portion 219, and the second main surface 212b is composed of a second main surface 212b1 of the first portion 218 and the second main surface 212b2 of the second portion 219. The contents of the description of the m-plane face and non-m-plane face of a quartz crystal can be used for side surfaces that are adjacent to the long sides of the first main surface 212a and the second main surface 212b. That is, a first side surface 213 of the quartz crystal blank 211 adjacent to long sides is composed of an m-plane face 213a that abuts on a long side of the first main surface 212a2 at an angle θ1 and a non-m-plane face 213b that abuts on a long side of a second main surface 212b2 at an angle θ2. A second side surface 214 of the quartz crystal blank 211 adjacent to long sides is composed of a non-m-plane face 214b that abuts on a long side of the first main surface 212a2 at the angle θ2 and an m-plane face 214a that abuts on a long side of the second main surface 212b2 at the angle θ1. In the quartz crystal blank according to the first or second embodiment, a structure having a step, which has a thickness that is 10% or more of the thickness of the quartz crystal blank, is additionally formed between the main surfaces of the thick middle portion and the thin peripheral portion in the direction normal to the main surfaces by placing resist films on the surfaces of the thick middle portion and by wet etching. In this case, portions of the m-plane faces and the non-m-plane faces near the first main surface and the second main surface are etched together with the thin peripheral portion. Thus, another first crystal surfaces, whose angle with respect to the main surface differs from that of the m-plane face, is generated in a part of the m-plane face near the first main surface and the second main surface, and another second crystal surface, whose angle with respect to the main surface differs from that of the non-m-plane face, is generated in a part of the non-m-plane face near the first main surface and the second main surface. In the present invention, the other first crystal surface and the other second crystal surface are each included in side surfaces.

In the present embodiment, a first excitation electrode 215a is formed on the first main surface 212a1 of the quartz crystal blank 211, a second excitation electrode 215b is formed on the second main surface 212b1 of the quartz crystal blank 211, and a first connection electrode 217a and a second connection electrode 217b are formed on the second main surface 212b2 of the quartz crystal blank 211. To be more specific, the first connection electrode 217a and the second connection electrode 217b are disposed near one short side of the second main surface 212b (on the positive X-axis side) and are arranged in the short-side direction of the second main surface 212b. An extension electrode 216 is electrically connected to the first excitation electrode 215a on the first main surface 212a and extends from the first main surface 212a1 to the second main surface 212b2 along the first main surface 212a2 and the second side surface 214. The extension electrode 216, which extends from the front surface to the back surface of the quartz crystal blank 211 in this way, can electrically connect the first excitation electrode 215a formed on the first main surface 212a1 and the first connection electrode 217a formed on a second main surface 212b2. The second connection electrode 217b is electrically connected to the second excitation electrode 215b formed on the second main surface 212b1.

The first portion 218 having a mesa shape may be formed, for example, by dry etching or by wet etching. By forming the first portion 218 by dry etching or the like, for example, a side surface of the first portion 218 can be formed so as to extend in the Y'-axis direction. In a case of wet etching, a side surface of the first portion 218 may be formed so as to be inclined at a predetermined angle from the Y'-axis direction.

The present embodiment has a vibration-energy confinement effect due to the mesa shape, in addition to the advantageous effects described above.

In each of the embodiments described above, a side surface is composed of two continuous surfaces. However, the present invention is not limited to this. A side surface may be composed of three or more surfaces. That is, a side surface may include an m-plane face, a non-m-plane face, and one or more plane faces between the m-plane face and the non-m-plane face.

The embodiments, which have been described above in order to facilitate understanding the present invention, do not limit the scope of the present invention. The present invention may be modified within the spirit and scope thereof and includes the equivalents thereof. That is, a modification of each of the embodiments that is appropriately modified in design by a person having ordinary skill in the art is included in the scope of the present invention as long as the modification has the features of the present invention. For example, elements of each of the embodiments; and the arrangement, the materials, the shapes, and the sizes of the elements are not limited to those described above as examples and may be modified as appropriate. Elements of the embodiments may be used in combination as long as the combination is technologically feasible, and such combination is also included in the scope of the present invention as long as the combination has the features of the present invention.

REFERENCE SIGNS LIST 1 quartz crystal resonator unit
10 quartz crystal resonator
11 quartz crystal blank
12a first main surface
12b second main surface
13 first side surface
14 second side surface
13a, 14a m-plane face
13b, 14b non-m-plane face
15a first excitation electrode
15b second excitation electrode
16 extension electrode
17a first connection electrode
17b second connection electrode
20 lid member
30 base member
36a, 36b electroconductive holding member

The invention claimed is:

1. A quartz crystal resonator comprising:
an AT-cut quartz crystal blank including a first main surface and a second main surface that face each other and each of which has a first long side and a second long side extending in an X-axis direction of the quartz crystal blank and a first short side and a second short side extending in a Z'-axis direction of the quartz crystal blank, a first side surface connecting the first long side of the first main surface to the first long side of the second main surface, and a second side surface connecting the second long side of the first main surface to the second long side of the second main surface;
a first excitation electrode on the first main surface of the quartz crystal blank;
a second excitation electrode on the second main surface of the quartz crystal blank;
an extension electrode that extends from the first main surface to the second main surface along the first side surface and electrically connected to the first excitation electrode;
a first connection electrode on the second main surface and electrically connected to the first excitation electrode via the extension electrode; and
a second connection electrode that is disposed on the second main surface and is electrically connected to the second excitation electrode,
wherein the first side surface includes a first m-plane face of the quartz crystal blank and a first non-m-plane face of the quartz crystal blank, the first m-plane face abutting the first long side of the first main surface at an angle θ1, and the first non-m-plane face abutting the first long side of the second main surface at an angle θ2,
wherein the second side surface includes a second non-m-plane face of the quartz crystal blank and a second m-plane face of the quartz crystal blank, the second non-m-plane face abutting the second long side of the first main surface at the angle θ2, and the second m-plane face abutting the second long side of the second main surface at the angle θ1, wherein the angles θ1 and θ2 are each obtuse angles, and the angle θ1 is larger than the angle θ2, and wherein a width of the first m-plane face is larger than a width of the second m-plane surface in a width direction that is perpendicular to the first and second long sides in the X-axis direction.

2. The quartz crystal resonator according to claim 1, wherein the first and second short sides of the second main surface are longer than the first and second short sides of the first main surface.

3. The quartz crystal resonator according to claim 1, wherein the first main surface and the second main surface are each a flat surface.

4. The quartz crystal resonator according to claim 1, wherein the quartz crystal blank includes a first portion that includes centers of the first main surface and the second main surface and a second portion that is adjacent to opposed ends of the first portion in the X-axis direction, and a thickness of the second portion is smaller than a thickness of the first portion.

5. A quartz crystal resonator unit comprising:
the quartz crystal resonator according to claim 1;
a base member that holds the quartz crystal resonator via an electroconductive holding member in such a way that the quartz crystal resonator is excitable; and
a lid member that is joined to the base member via a joining material and that contains the quartz crystal resonator unit in an inner space defined between the base member and the lid member,
wherein the electroconductive holding member is disposed between the second main surface of the quartz crystal resonator having the first connection electrode and second connection electrode and the base member.

6. The quartz crystal resonator according to claim 1, wherein the angle θ2 is 93±2 degrees.

7. The quartz crystal resonator according to claim 1, wherein the angle θ1 is 144±2 degrees.

8. A quartz crystal resonator comprising:
an AT-cut quartz crystal blank including a first main surface and a second main surface that face each other and each of which has a first long side and a second long side extending in an X-axis direction of the quartz crystal blank and a first short side and a second short side extending in a Z'-axis direction of the quartz crystal blank, a first side surface connecting the first long side of the first main surface to the first long side of the second main surface, and a second side surface connecting the second long side of the first main surface to the second long side of the second main surface;
a first excitation electrode on the first main surface of the quartz crystal blank;
a second excitation electrode on the second main surface of the quartz crystal blank;
an extension electrode that extends from the first main surface to the second main surface along the second side surface and electrically connected to the first excitation electrode;

a first connection electrode on the second main surface and electrically connected to the first excitation electrode via the extension electrode; and a second connection electrode on the second main surface and electrically connected to the second excitation electrode, wherein the first side surface includes a first non-m-plane face of the quartz crystal blank and a first m-plane face of the quartz crystal blank, the first non-m-plane face abutting the first long side of the second main surface at an angle θ2, and the first m-plane face abutting the first long side of the first main surface at an angle θ1, wherein the second side surface includes a second m-plane face of the quartz crystal blank and a second non-m-plane face of the quartz crystal blank, the second m-plane face abutting the second long side of the second main surface at the angle θ1, and the second non-m-plane face abutting the second long side of the first main surface at the angle θ2, wherein the angles θ1 and θ2 are each obtuse angles, and the angle θ1 is larger than the angle θ2, and wherein a width of the second m-plane surface is larger than a width of the first m-plane surface in a width direction that is perpendicular to the first and second long sides in the X-axis direction.

9. The quartz crystal resonator according to claim 8, wherein the first and second short sides of the first main surface are longer than the first and second short sides of the second main surface.

10. The quartz crystal resonator according to claim 8, wherein the first main surface and the second main surface are each a flat surface.

11. The quartz crystal resonator according to claim 8, wherein the quartz crystal blank includes a first portion that includes centers of the first main surface and the second main surface and a second portion that is adjacent to opposed ends of the first portion in the X-axis direction, and a thickness of the second portion is smaller than a thickness of the first portion.

12. A quartz crystal resonator unit comprising:
the quartz crystal resonator according to claim 8;
a base member that holds the quartz crystal resonator via an electroconductive holding member in such a way that the quartz crystal resonator is excitable; and
a lid member that is joined to the base member via a joining material and that contains the quartz crystal resonator unit in an inner space defined between the base member and the lid member,
wherein the electroconductive holding member is disposed between the second main surface of the quartz crystal resonator having the first connection electrode and second connection electrode and the base member.

13. The quartz crystal resonator according to claim 8, wherein the angle θ2 is 93±2 degrees.

14. The quartz crystal resonator according to claim 8, wherein the angle θ1 is 144±2 degrees.

* * * * *